United States Patent
Ho

(10) Patent No.: US 10,418,109 B1
(45) Date of Patent: Sep. 17, 2019

(54) MEMORY DEVICE AND PROGRAMMING METHOD OF MEMORY CELL ARRAY

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/046,958

(22) Filed: Jul. 26, 2018

(51) Int. Cl.
| | |
|---|---|
| G11C 16/04 | (2006.01) |
| G11C 16/10 | (2006.01) |
| G11C 16/08 | (2006.01) |
| G06F 3/06 | (2006.01) |
| G11C 16/30 | (2006.01) |

(52) U.S. Cl.
CPC ............ G11C 16/10 (2013.01); G06F 3/0604 (2013.01); G06F 3/0659 (2013.01); G06F 3/0673 (2013.01); G11C 16/08 (2013.01); G11C 16/30 (2013.01); *G11C 16/0483* (2013.01)

(58) Field of Classification Search
CPC .................................................. G11C 16/0483
USPC ....................................................... 365/185.17
See application file for complete search history.

(56) References Cited

U.S. PATENT DOCUMENTS

| | | |
|---|---|---|
| 7,274,599 B2 | 9/2007 | Lee |
| 2006/0146636 A1 | 7/2006 | Hsu et al. |
| 2017/0200502 A1* | 7/2017 | Yoon ...................... G11C 16/08 |

FOREIGN PATENT DOCUMENTS

| | | |
|---|---|---|
| CN | 103198862 | 12/2016 |
| TW | 574702 | 2/2004 |
| TW | 201239887 | 10/2012 |
| TW | 201440071 | 10/2014 |
| TW | 201714091 | 4/2017 |

OTHER PUBLICATIONS

"Office Action of Taiwan Counterpart Application", dated Oct. 15, 2018, p. 1-p. 5.

* cited by examiner

*Primary Examiner* — Hoai V Ho
(74) *Attorney, Agent, or Firm* — JCIPRNET

(57) ABSTRACT

A memory device and a programming method for a memory cell array are provided. The memory device includes a memory cell array, a selection switch, a row decoder, a voltage generator, and a memory controller. The memory controller controls the row decoder according to input data to adjust a control path sequence of address control signals, and the memory controller simultaneously controls the voltage generator to adjust a data path sequence of input data signals, so as to perform a programming operation on memory cells of the memory cell array.

16 Claims, 5 Drawing Sheets

MEMORY DEVICE AND PROGRAMMING METHOD OF MEMORY CELL ARRAY

TECHNICAL FIELD

The disclosure relates to a technology of controlling a memory device; particularly, the disclosure relates to a memory device capable of reducing the time spent on performing a programming operation and a programming method of a memory cell array.

DESCRIPTION OF THE RELATED ART

The cache memory can be mainly categorized into two types: an NOR cache memory and an NAND cache memory. Compared to the NAND cache memory, the NOR type cache memory takes a long time to perform the programming/erasing operation.

If it is desired to accelerate the programming operation on the NOR cache memory and shorten the time required for performing the programming operation (usually referred to as tPP), it seems that the detailed process of programming the NOR cache memory may be adjusted. The programming operation may generally be divided into two parts: a programming (PGM) pulse operation and a programming verification (PV) operation. In the programming pulse operation, a high voltage is applied to a target memory cell to adjust the threshold voltage (Vt) of the target memory cell (e.g., to increase the threshold voltage of the target memory cell). The PV operation is to verify whether the target memory cell reaches the predetermined threshold voltage and thereby make sure the target memory cell already stores the input data. The time tPP spent on performing the programming operation is mainly occupied by the programming pulse operation.

Since the programming operation in the NOR cache memory requires a large amount of current and is subject to the pumping capacity of the hardware circuit, only a certain number of data paths may be driven in the programming pulse operation, resulting in the need for repeatedly and sequentially performing the programming pulse operation to completely write the input data. Nevertheless, the data writing method of the cache memory is to perform the erasing operation on all the memory cells and then perform the programming operation on all of the memory cells; as a matter of fact, the programming operation may not be necessary performed on each of the memory cells.

Hence, how to reduce the time required for programming the cache memory is one of the important topics.

SUMMARY

The disclosure provides a memory device and a programming method of a memory cell array. A data path sequence of input data signals is re-arranged according to the contents of input data, and a control path sequence of address control signals is re-arranged at the same time, so as to skip over the memory cells that need not to be programmed. As such, the time spent on the programming operation may be reduced.

In an embodiment, a memory device including a memory cell array, a selection switch, a row decoder, a voltage generator, and a memory controller is provided. The memory cell array includes a plurality of memory cells. The selection switch is coupled to the memory cell array. The row decoder is coupled to the selection switch and receives a memory cell address to generate address control signals. The voltage generator is coupled to the selection switch. The memory controller is coupled to the row decoder and the voltage generator. Here, the memory controller obtains input data to control the voltage generator to generate input data signals. The memory controller controls the row decoder to adjust a control path sequence of the address control signals according to the input data, and the memory controller simultaneously controls the voltage generator to adjust a data path sequence of the input data signals, so as to perform in a programming operation on the memory cells.

In an embodiment, a programming method of a memory cell array includes following steps. Input data are obtained to generate input data signals. A control path sequence of address control signals is adjusted according to the input data, and a data path sequence of the input data signals is simultaneously adjusted. A programming operation is performed on some or all of a plurality of memory cells in the memory cell array according to the address control signals and the input data signals.

To make the above features and advantages provided in one or more of the embodiments more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
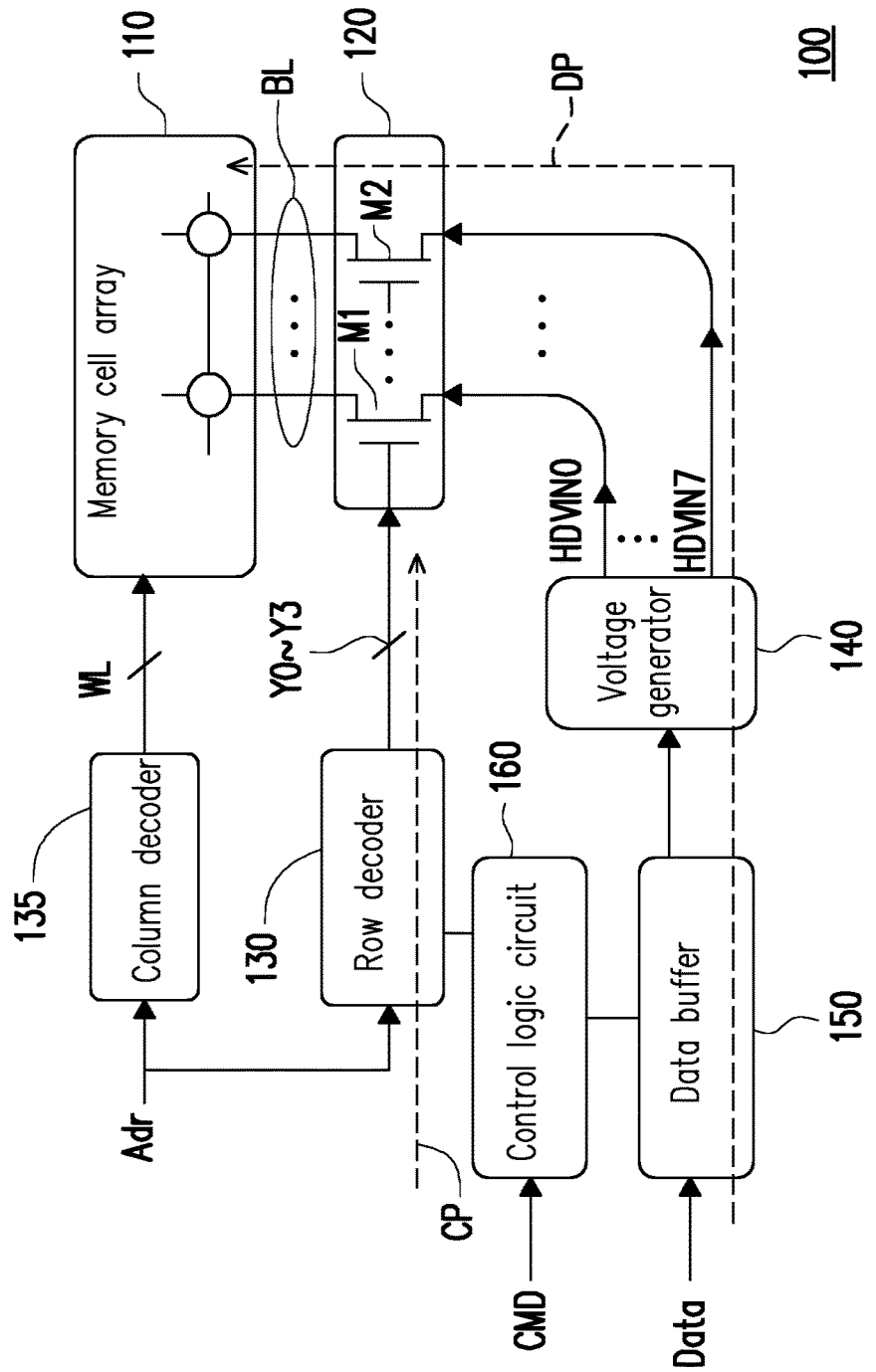
FIG. 1 is a block view of a memory device.

FIG. 1 is a block view of a memory device 100. The memory device 100 provided in the present embodiment may be an NOR cache memory. Each element depicted in FIG. 1 is mainly configured to perform a PGM pulse operation on memory cells. The memory device 100 includes a memory cell array 110, a selection switch 120, a row decoder 130, a voltage generator 140, and a control logic circuit 160. The memory device 100 also includes a column decoder 135 and a data buffer 150.

The memory cell array 110 includes a plurality of memory cells. The selection switch 120 is coupled to the memory cell array 110. In the present embodiment, the selection switch 120 may be a row selection switch and may be equipped with a plurality of path switches (implemented in form of transistors M1 and M2 in FIG. 1), and each path switch corresponds to one data path. The column decoder 135 receives a memory cell address Adr to provide word lines WL to the memory cell array 110. The row decoder 130 is coupled to the selection switch 120. The row decoder 130 receives the memory cell address Adr to generate address control signals. In the present embodiment, the address control signals are exemplified as Y0-Y3. The voltage generator 140 is coupled to the selection switch 120 to provide input data signals for each path switch. In the present embodiment, the input data signals are exemplified as HVDIN0-HVDIN7. The voltage generator 140 may be implemented in form of voltage pump circuit, which may also be referred to as a high voltage (HV) circuit.

The data buffer 150 is configured to receive and temporarily store input data Data. The control logic circuit 160 controls the data buffer 150 and the voltage generator according to an externally provided command CMD to generate the input data signals HVDIN0-HVDIN7. In the present embodiment, the data buffer 150 may also receive and temporarily store the command CMD. The selection switch 120 is controlled by the address control signals Y0-Y3 and the input data signals HVDIN0-HVDIN7 to provide bit lines BL to the memory cell array 110.

To better explain the following embodiments, the "data path DP" provided in the present embodiment is defined to include following steps: (1) the input data Data are input to the memory device 100 and temporarily stored in the data buffer 150; (2) the control logic circuit 160 sequentially transfers the input data Data temporarily stored in the data buffer 150 to the voltage generator 140 according to the command CMD; (3) the voltage generator 140 converts the input data Data located in the logic domain into the input data signals (e.g., HVDIN0-HVDIN7) in the high voltage domain, and the input data signals are supplied to a data input terminal of the selection switch 120; (4) the memory cells on which the PGM pulse operation is to be performed perform a programming bias operation on the bit lines BL generated according to the input data signals. If the PGM pulse operation is to be performed on specific memory cells, the input data signals corresponding to the specific memory cells are high voltage signals; otherwise, the corresponding input data signals are at 0 volt (V). In the present embodiment, the "control path CP" is defined to include the following steps: (1) the row decoder 130 obtains the memory cell address Adr; (2) the row decoder 130 decodes the memory cell Adr to control some path switches in the selection switch 120 to be turned on, and thereby the input data signals corresponding to the path switches may be transmitted through the path switches and reach the specific memory cells.

How the PGM pulse operation affects the overall time spent on the programming operation will be elaborated hereinafter. In an NOR flash memory, the number of memory cell bits that can be programmed at the same time is determined according to the driving capability of the voltage generator 140 for an electric current. The programming operation performed on the memory cells requires a large amount of the electric current for driving the memory cells; however, due to the limited driving capability for the electric current, the voltage generator 140 is unable to drive a great number of memory cells. Accordingly, the control logic circuit 160 is often applied to sequentially arrange the input data Data, so as to separately and partially perform the programming operation on the memory cells until the operation is completed. Namely, the control logic circuit 160 arranges the data path sequence of the data paths DP according to a data path scheme, so as to determine the time spent on the programming operation. The "pump capacity" provided in the present embodiment is the number of bits of the PGM pulse operation performed by the voltage generator 140 on the to-be-programmed memory cells at the same time.

Figure 2:
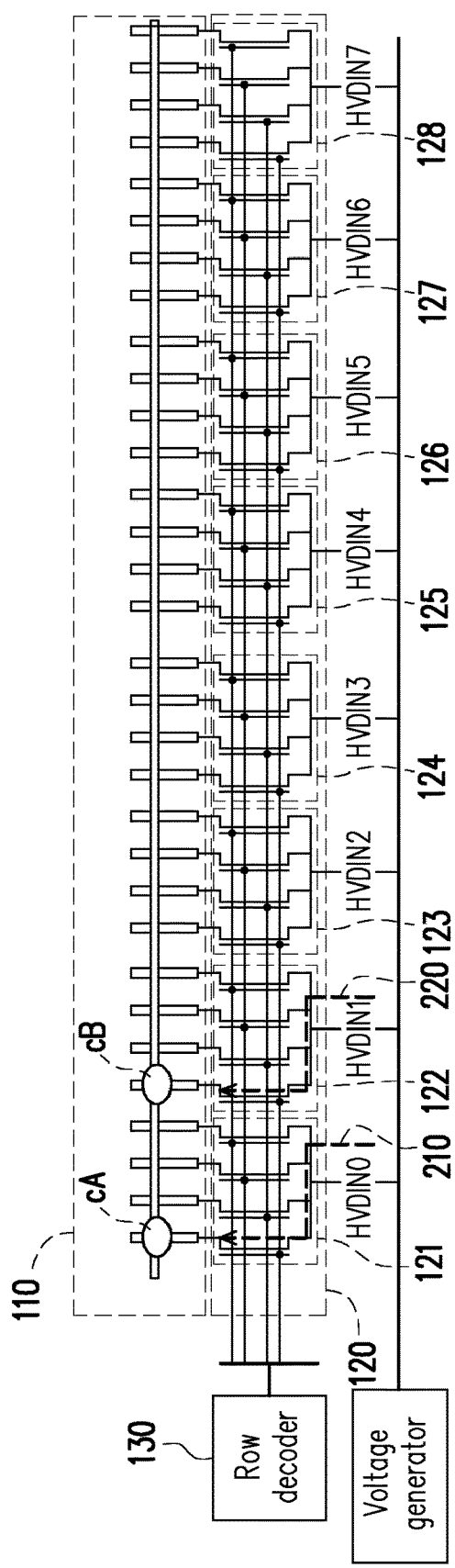
FIG. 2 illustrates detailed circuitry of some elements in the memory device depicted in FIG. 1.

FIG. 2 illustrates detailed circuitry of some elements in the memory device 100 depicted in FIG. 1. With reference to FIG. 2, it is assumed that there are 32 to-be-programmed memory cells in the memory cell array 110; the selection switch 120 has a plurality of data path groups 121-128 (e.g., 8 data path groups), and each data path group is composed of a plurality of path switches (e.g., 4 path switches). The number of bits (i.e., 4) of one of the address control signals Y0-Y3 is equal to the number of path switches (i.e., 4) in one data path group. The number of the memory cells to be programmed in the memory cell array 110 (i.e., 32) is equal to the product obtained by multiplying the number of path switches in a single data path group (i.e., 4) by the number of data path groups (i.e., 8). The number of data path groups 121-128 (i.e., 8) is greater than the pump capacity (i.e., 2).

In the present embodiment, the number of bits of the PGM pulse operation performed on the to-be-programmed memory cells at the same time is 2. That is, the pump capacity of the voltage generator 140 is 2. For instance, if the first PGM pulse operation is to be performed on the memory cell cA and the memory cell cB, a signal corresponding to the input data signals HVDIN0 and HVDIN1 should be provided (e.g., if the programming operation need be performed on the memory cells, the input data signals are high voltage signals; if the programming operation need not be performed on the memory cells, the input data signals are at 0V). Besides, the specific path(s) switch in the data path groups 121 and 122 is controlled to be turned on through the address control signal Y0, so that the input data signals HVDIN0 and HVDIN1 are transmitted to the memory cells cA and cB in the manner as shown by the arrows 210 and 220 in FIG. 2 to perform the PGM pulse operation. That is, the PGM pulse operations are required to be performed for 16 number of times for completing the PGM pulse operations on the 32-bit memory cells.

Table 1 shows the control path sequence and data path sequence while the PGM pulse operations are performed on the 32-bit memory cells for 16 number of times. "The control path sequence" indicates the order of turning on some path switches through the address control signals; "the data path sequence" indicates the order of inputting the input data signals.

TABLE 1

| Number of Times of Performing PGM Pulse Operations | Control Path Sequence | Data Path Sequence |
|---|---|---|
| 1 | Y0 | HVDIN0/HDVIN1 |
| 2 | Y0 | HVDIN2/HDVIN3 |
| 3 | Y0 | HVDIN4/HDVIN5 |
| 4 | Y0 | HVDIN6/HDVIN7 |
| 5 | Y1 | HVDIN0/HDVIN1 |
| 6 | Y1 | HVDIN2/HDVIN3 |
| 7 | Y1 | HVDIN4/HDVIN5 |
| 8 | Y1 | HVDIN6/HDVIN7 |
| 9 | Y2 | HVDIN0/HDVIN1 |
| 10 | Y2 | HVDIN2/HDVIN3 |
| 11 | Y2 | HVDIN4/HDVIN5 |
| 12 | Y2 | HVDIN6/HDVIN7 |
| 13 | Y3 | HVDIN0/HDVIN1 |
| 14 | Y3 | HVDIN2/HDVIN3 |
| 15 | Y3 | HVDIN4/HDVIN5 |
| 16 | Y3 | HVDIN6/HDVIN7 |

It can be learned from Table 1 that the memory device 100 in FIG. 1 performs the PGM pulse operation on the 32-bit memory cells one by one. In the data path scheme, as long as the corresponding control path sequence and the corresponding data path sequence may be generated according to the received memory cell address Adr and the order of the input data Data, the row decoder 130 and the control logic circuit 160 depicted in FIG. 1 do not need to refer to the input data Data to adjust the control path sequence of the control path CP and the data path sequence of the data path DP.

However, said data path scheme consumes significant amount of time because a number of memory cells that do not require the programming operation have still undergone the programming operation, which will be elaborated hereinafter. According to the order of writing data into a flash memory, an erasing operation is performed to reset the memory cells in the entire flash memory device as logic "1", and a programming operation is performed on the memory cells, so as to revise the bit of some memory cells to logic "0". That is, it is not necessary to perform the programming operation on the 32-bit memory cells each time.

For instance, if the programming operation is required to be performed on the memory cell cA depicted in FIG. 2, but the memory cell cB need not be programmed, the voltage generator 140 still transmits the high voltage data to the input data signal HVDIN0 and transmits 0V to the input data signal HVDIN1 while performing the PGM pulse operation for the first time (i.e., the number of times of performing the PGM pulse operation is 1).

Besides, diverse input data Data affects the efficiency of the voltage generator 140 in operation. For instance, in the data path scheme according to Table 1, whether the arrangement of bits of the input data Data requires each memory cell to be supplied with the electric current by the voltage generator 140 for performing the PGM pulse operation is not taken into consideration. The specific mapping relationship between the physical addresses and the logic addresses of the memory cells will be described in the embodiments provided below. Here, the bit values corresponding to the physical addresses B0 and B1 and the logic addresses D00 and D08 are taken for example. If the two bit values corresponding to the logic addresses D00 and D08 in the input data Data are both logic "1", the utilization rate of the voltage generator 140 is 0 because no high voltage signal is needed. If one of the bit values corresponding to the logic address D00 or the logic address D08 in the input data Data is logic "0", and the other bit value is logic "1", the utilization rate of the voltage generator 140 is 50%. The utilization rate of the voltage generator 140 reaches 100% if the two bit values corresponding to the logic addresses D00 and D08 in the input data Data are both logic "0". In other words, as long as the utilization rate of the voltage generate 140 does not reach 100%, the time spent on performing the PGM pulse operation is a waste.

Figure 3:
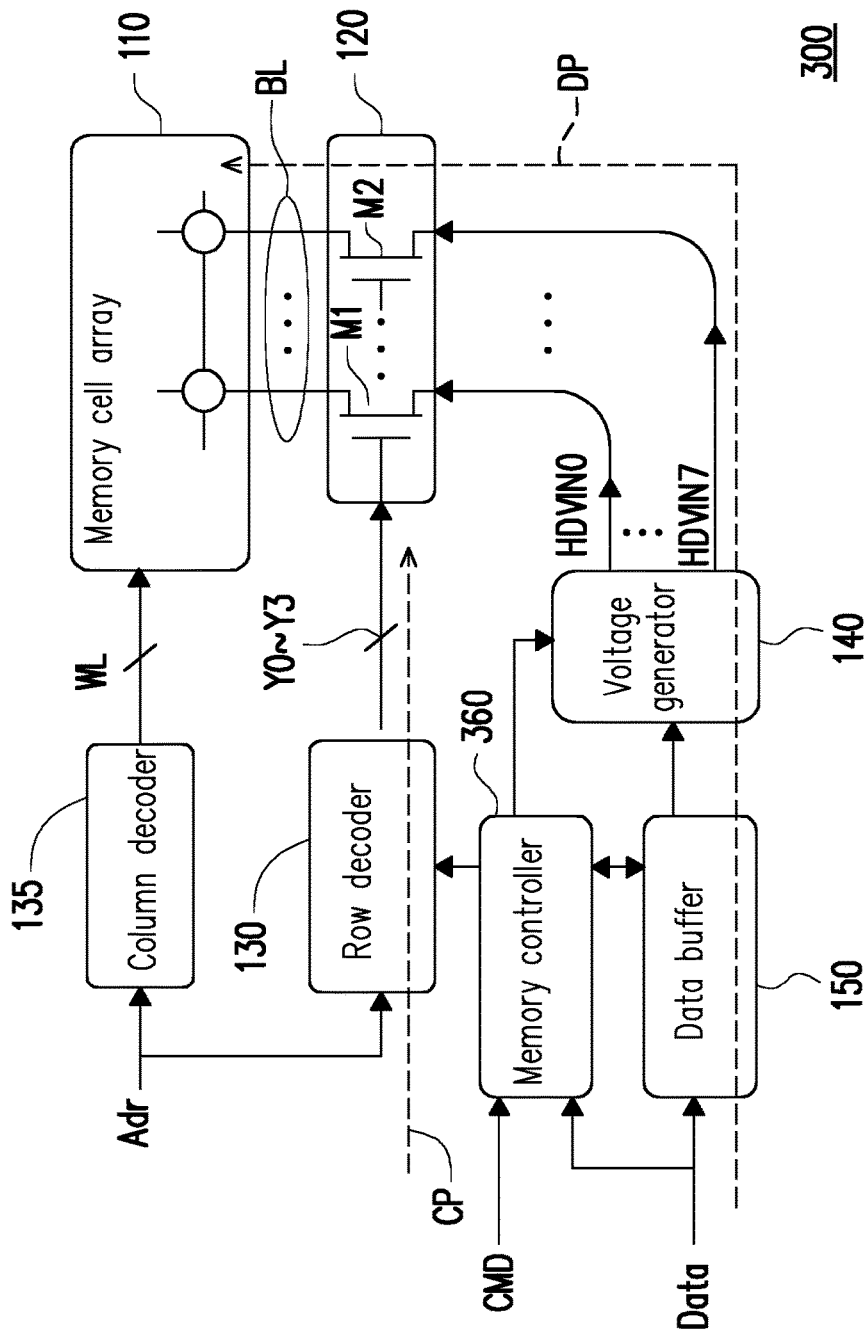
FIG. 3 is a block view of a memory device according to an embodiment of the disclosure.

FIG. 3 is a block view of a memory device 300 according to an embodiment of the disclosure. The difference between FIG. 1 and FIG. 3 lies in that the control logic circuit 160 depicted in FIG. 1 is replaced by the memory controller 360 depicted in FIG. 3. The memory controller 360 depicted in FIG. 3 is not only coupled to the data buffer 150 and the voltage generator 140 but also coupled to the row decoder 130. In the present embodiment, the memory controller 360 may directly read the input data Data and the command CMD, and may also read the required input data Data from the data buffer 150. In other words, the memory controller 360 and the data buffer 150 may be bidirectionally connected, so that the memory controller 360 may control the data buffer 150 to read and temporarily store the input data Data. The memory controller 360 depicted in FIG. 3 controls the row decoder 130 according to input data Data to adjust the control path sequence of the address control signals Y0-Y3, and the memory controller 360 simultaneously controls the voltage generator 140 to adjust the data path sequence of the input data signals HDVIN0-HDVIN7 according to input data Data, so as to perform the programming operation on memory cells of the memory cell array 110. The memory controller 360 may be implemented in form of a control unit, such as a logic circuit, a microprocessor, or the like.

If the memory device 100 shown in FIG. 1 is compared with the memory device 300 shown in FIG. 3, the control logic circuit 160 shown FIG. 1 can only control the data path DP. By contrast, the memory controller 360 shown in FIG. 3 can simultaneously control the data path DP and the control path CP according to the bit data of the input data Data to rearrange the contents of the data path sequence and the control path sequence. Thereby, the memory cells that require the programming operation may undergo such an operation, and the memory cells that do not need such an operation are skipped over. As such, the number of times of performing the programming operation in the memory device 300 may be reduced, so as to reduce the time spent on the programming operation. The embodiments that may cover the scope and the spirit of the invention are provided hereinafter, and people who apply the present embodiment may make necessary adjustments to the following embodiments according to their needs.

Figure 4:
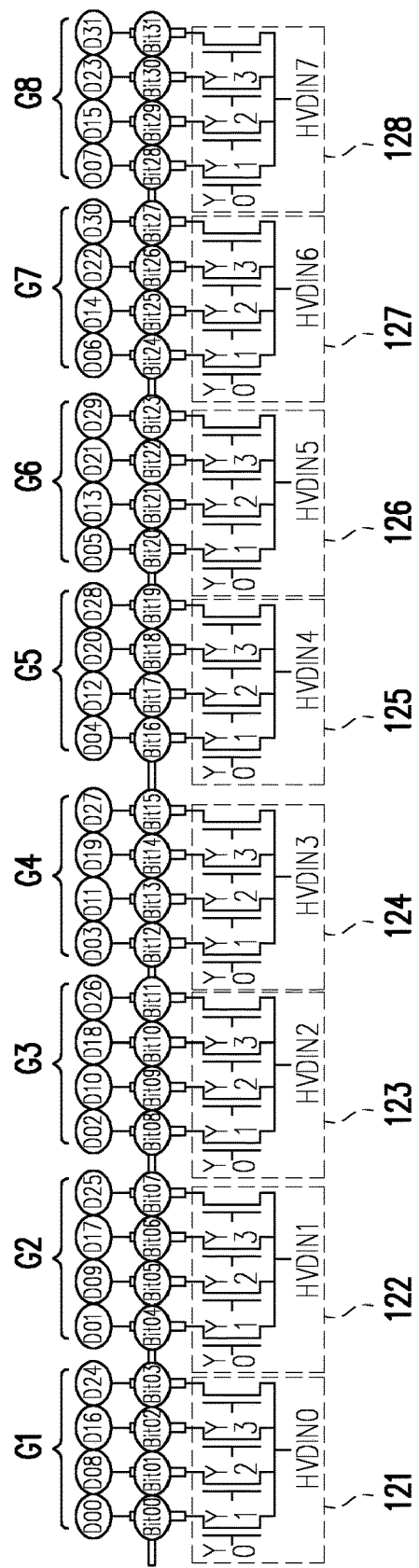
FIG. 4 illustrates mapping relationship between physical addresses Bit00-Bit32 and logic addresses D00-D31 of memory cells.

Here, the mapping relationship between the physical addresses and the logic addresses of the memory cell is described. FIG. 4 illustrates the mapping relationship between physical addresses Bit00-Bit32 and logic addresses D00-D31 of memory cells. As shown in FIG. 4, based on the application of the cache memory device, the physical addresses of the memory cells are different from the logic addresses of the memory cells. If it is intended to sequentially access the memory cells, the access speed is excessively low. Hence, in this embodiment, the to-be-programmed memory cells (e.g., the 32-bit memory cells) are categorized into a plurality of memory cell groups (e.g., 8 memory cell groups G1-G8) according to the number of data path groups 121 to 128 (e.g., 8) and the physical addresses Bit00-Bit32 of the to-be-programmed memory cells. Each of the memory cell groups G1-G8 respectively corresponds to one of the data path groups 121-128. The mapping relationship between the physical addresses and the logic addresses of the to-be-programmed memory cells is: the physical address of a $j^{th}$ memory cell in an $i^{th}$ memory cell group is $[(i-1)\times 4+(j-1)]$, the logic address of the $j^{th}$ memory cell in the $i^{th}$ memory cell group is $[(j-1)\times 8+(i-1)]$, i and j are positive integers, i is smaller than or equal to the number of the data path groups 121-128 (i.e., 8), and j is smaller than or equal to the number of the path switches (i.e., 4) in one of the data path groups. For instance, the physical address of the first memory cell in the first memory cell group is Bit00 ("0×8+0"), and its logic address is D00 ("0×8+0"); the physical address of the first memory cell in the third memory cell group is Bit08 ("2×4+0"), and its logic address is D02 ("0×8+2"); the physical address of the third memory cell in the fifth memory cell group is Bit18 ("4×4+2"), and its logic address is D20 ("2×8+4"). The logic addresses D00-D31 of the of memory cells in the memory cell groups G1-G8 are the same as the logic address of the input data Data.

Figure 5:
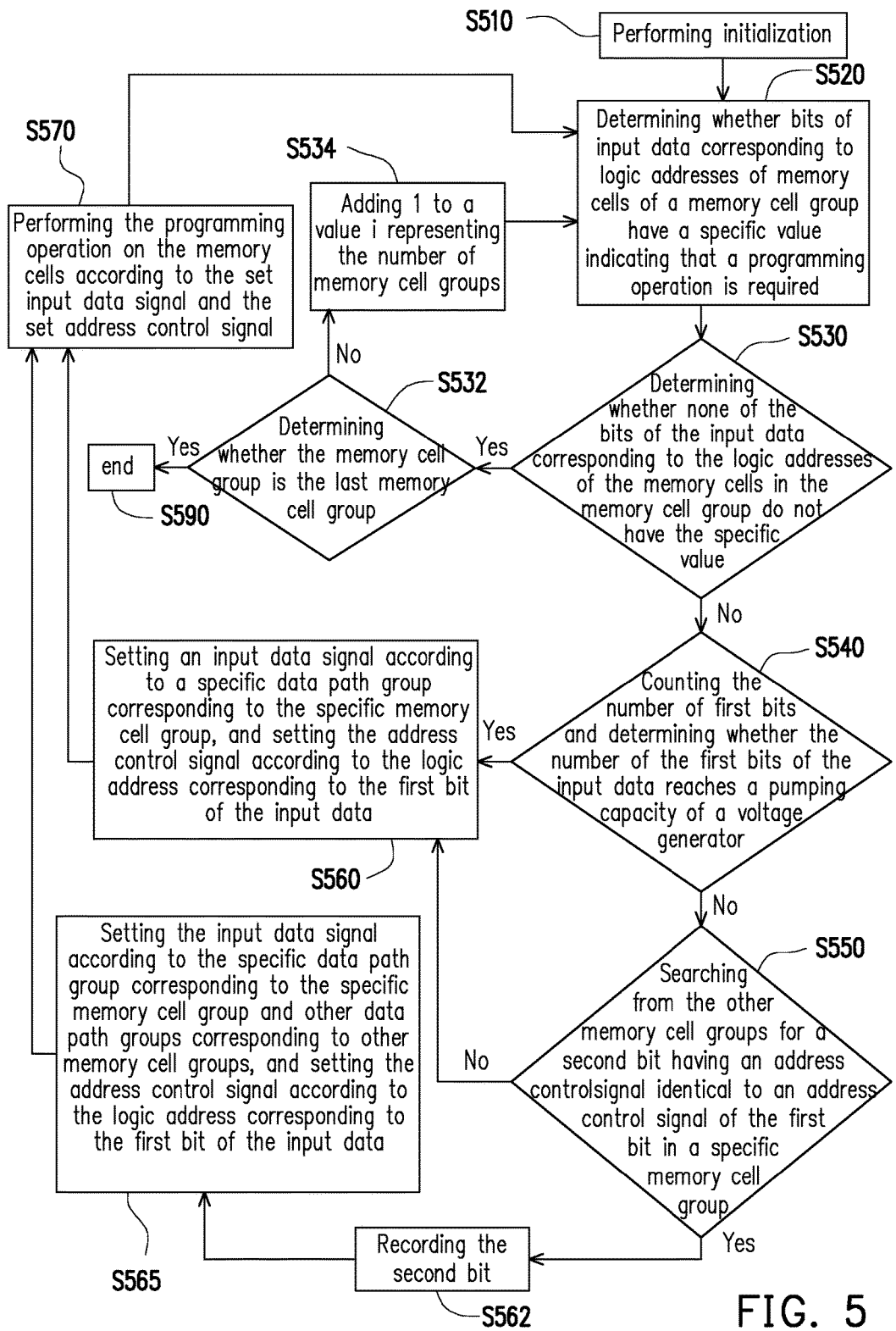
FIG. 5 is a flow chart illustrating a programming method of a memory cell array according to an embodiment of the disclosure.

The data path scheme adopted by the memory controller 360 in FIG. 3 will be described with reference to FIG. 5 to implement the PGM pulse operation described in the embodiment of the disclosure. FIG. 5 is a flow chart illustrating a programming method of a memory cell array according to an embodiment of the disclosure. Here, the input data Data[31:0] equal to (1111-1110-1111-1100-1111-

0010-1111-1100) are taken as an example. For instance, the bits Data[0], Data[8], Data[16], Data[24], Data[1], Data[17], Data[10], and Data[11] are all logic "0", and the other bits of the input data Data are logic "1". Besides, note that the logic address of Data[0] is D00; the logic address of the bit Data[1] is D01, and the rest may be deduced therefrom.

With reference to FIG. 3 and FIG. 5, in step S510, the memory controller 360 performs initialization and sets the first memory cell group G1 as the memory cell group to be searched in following steps. That is, the memory controller 360 sets i as 1 (i=1) to indicate the first memory cell group G1.

The memory controller 360 then sequentially searches in the input data Data for at least one first bit having a specific value, the at least one first bit is corresponding to the logic addresses of the memory cells of the memory cell groups, and the specific value indicates that the programming operation is required. For instance, in step S520, since the memory cell group to be searched is set as the first memory cell group G1 in advance in the step S510, the memory controller 360 determines whether the bits (i.e., Data[0], Data[8], Data[16], and Data[24]) of the input data Data corresponding to the logic addresses (i.e., the logic addresses D00, D08, D16, and D24) of the memory cells of the first memory cell group G1 have the specific value (e.g., logic "0") indicating that the programming operation is required. In step S530, the memory controller 360 determines whether none of the bits Data[0], Data[8], Data[16], and Data[24] of the input data Data corresponding to the logic addresses D00, D08, D16, and D24 of the memory cells in the first memory cell group G1 do not have the specific value. If the memory controller 360 determines that the bits Data[0], Data[8], Data[16], and Data[24] of the input data Data corresponding to the logic addresses D00, D08, D16, and D24 of the memory cells in the first memory cell group G1 are not logic "0" but logic "1", step S532 is further performed after the step S530, and the memory controller 360 determines whether the memory cell group is the last memory cell group G8. That is, the memory controller 360 determines whether i is 8. If the memory cell group is not the last memory cell group, step S534 is further performed after the step S532 to add 1 to the value i representing the number of the memory cell groups (i.e., i++1), and the step S520 is performed again to determine whether the bits of the input data Data mapped to the logic addresses (i.e., the logic addresses D01, D09, D17, and D25) of the memory cells of the next memory cell group (e.g., the second memory cell group G2) have the specific value (e.g., logic "0") indicating that the programming operation is required.

If the memory controller 360 already determines the specific value (e.g., logic "0") from at least one first bit corresponding to the logic addresses D00, D08, D16, and D24 of the memory cells in a specific memory cell group (e.g., the first memory cell group G1), e.g., the bit Data[0] is logic "0", step S540 is performed after the step S530, and the memory controller 360 counts the number of the at least one first bit and determines whether the number of the first bits of the input data Data reaches a pumping capacity (i.e., 2) of the voltage generator.

In this embodiment, since the bits Data[0] and Data[8] corresponding to the logic addresses D00 and D08 are both logic "0", the bits Data[0] and Data[8] both belong to "the first bit", and the number of the "first bits" reaches 2.

If the number of the first bits of the input data Data reaches the pumping capacity (i.e., 2), step S560 is performed after the step 540, and the memory controller 360 sets the input data signal HVDIN0 according to a specific data path group 121 corresponding to the specific memory cell group G1, and sets the address control signals Y0 and Y1 according to the logic addresses D0 and D8 corresponding to the first bits (i.e., the bits Data[0] and Data[8]) of the input data Data. The logic addresses D00 and D08 correspond to the address control signals Y0 and Y1, respectively. Besides, the logic addresses D00 and D08 correspond to the physical addresses Bit00 and Bit01 of the memory cells, respectively. At this time, the number of times of performing the PGM pulse operations, the control path sequence, and the data path sequence are shown in Table 2.

TABLE 2

| Number of Times of Performing PGM Pulse Operations | Control Path Sequence | Data Path Sequence | Physical Addresses of To-Be-Programmed Memory Cells |
|---|---|---|---|
| 1 | Y0/Y1 | HVDIN0 | Bit00/Bit01 |

In step S570, the memory controller 360 controls the row decoder 130 to adjust the control path sequence of the address control signals according to the set address control signals Y0/Y1 and the set input data signal HVDIN0 in row data corresponding to the number of times (i.e., 1) of performing the PGM pulse operations shown in Table 2 above, and the memory controller 360 simultaneously controls the voltage generator 140 to adjust the data path sequence of the input data signal, so as to perform the programming operation on the corresponding memory cells. After the step S570 is completed, go back to the step S520 to further perform the programming operation on the memory cells.

In the present embodiment, since the bits Data[16] and Data[24] of the input data Data in the same memory cell group G1 are also logic "0", as provided in the aforesaid steps S520, S530, S540, S560, and S570, the programming operation is performed on the specific data path group G1 and the memory cells corresponding to the logic addresses D16 and D24 according to the set input data signals and the set address control signals. The logic addresses D16 and D24 correspond to the physical addresses Bit02 and Bit03 of the memory cell, respectively. Row data corresponding to the number of times (i.e., 2) of performing the PGM pulse operations are added to Table 2, which is shown in Table 3 below.

TABLE 3

| Number of Times of Performing PGM Pulse Operations | Control Path Sequence | Data Path Sequence | Physical Addresses of To-Be-Programmed Memory Cells |
|---|---|---|---|
| 1 | Y0/Y1 | HVDIN0 | Bit00/Bit01 |
| 2 | Y2/Y3 | HVDIN0 | Bit02/Bit03 |

The step S520 is then performed after the step S570. Since each memory cell in the memory cell group G1 has undergone the PGM pulses operation, the memory controller 360 determines whether the bits (i.e., Data[1], Data[9], Data[17], and Data[25]) of the input data Data corresponding to the logic addresses (i.e., the logic addresses D01, D09, D17, and D25) of the memory cells of the next memory cell group (i.e., the second memory cell group G2) have the specific value (e.g., logic "0") indicating that the programming operation is required.

Since the memory controller 360 determines that the bits Data[1] and Data[17] of the input data Data corresponding to the logic addresses D01 and D17 of the memory cells of the memory cell group G2 are logic "0", the step S540 is performed after the steps S530 and S540, and the memory controller 360 counts the number of the first bits (the bits Data[1] and Data[17]) to 2. The step S570 is then performed after the steps S540 and S560, and the memory controller 360 sets the input data signal HVDIN01 according to a specific data path group 122 corresponding to the specific memory cell group G2, and sets the address control signals Y0 and Y3 according to the logic addresses D01 and D17 corresponding to the first bits (i.e., the bits Data[1] and Data[17]) of the input data Data. The logic addresses D01 and D17 correspond to the address control signals Y0 and Y3, respectively. The memory controller 360 then performs the programming operation on the memory cells corresponding to the specific memory cell group G2 and the logic addresses D01 and D17 according to the row data corresponding to the number of times (i.e., 3) of performing the PGM pulse operations in Table 4 below. The logic addresses D01 and D17 correspond to the physical addresses Bit04 and Bit06 of the memory cells, respectively.

TABLE 4

| Number of Times of Performing PGM Pulse Operations | Control Path Sequence | Data Path Sequence | Physical Addresses of To-Be-Programmed Memory Cells |
| --- | --- | --- | --- |
| 1 | Y0/Y1 | HVDIN0 | Bit00/Bit01 |
| 2 | Y2/Y3 | HVDIN0 | Bit02/Bit03 |
| 3 | Y0/Y2 | HVDIN1 | Bit04/Bit06 |

Go back to the step S520. The memory controller 360 determines whether the bit (i.e., Data[25]) of the input data Data corresponding to the logic address (i.e., the logic address D25) of the memory cells of the memory cell group G2 has the specific value (e.g., logic "0") indicating that the programming operation is required. Since the bit Data[25] is not logic "0", and the bits of the input data Data in the corresponding memory cell group G2 have all been searched, step S534 is then performed after steps S530 and S532, and the memory controller 360 adds 1 to the numeral value i representing the memory cell group (i.e., i=3), and go back to the step S520.

The memory controller 360 determines whether the bits (i.e., Data[2], Data[10], Data[18], and Data[26]) of the input data Data corresponding to the logic addresses (i.e., the logic addresses D02, D10, D18, and D26) of the memory cells of the memory cell group G3 have the specific value (e.g., logic "0"). Since the memory controller 360 determines that only the bit Data [10] of the bits Data[2], Data[10], Data[18], and Data[26] is logic "0", the step S540 is performed after the step S530, and the memory controller 360 counts the number of the first bits and determines whether the number of the first bits of the input data Data reaches a pumping capacity (i.e., 2) of the voltage generator. In this embodiment, only the bit Data[10] corresponding to the logic address in the memory cell group G3 is "first bits". Hence, if the number of the first bits of the input data Data does not reach the pumping capacity (i.e., 2) of the voltage generator, step S550 is performed after the step S540, and the memory controller 360 searches from the other memory cell groups (e.g., the memory cell groups G4-G8) for a second bit having an address control signal identical to the address control signal Y1 of the first bit (i.e., Data [10]) in the specific memory cell group (i.e., the memory cell group G3). In this embodiment, the address control signal corresponding to the bit Data[10] is Y1, and therefore the memory controller 360 searches in the memory cell groups G4-G8 for the bit having the same address control signal Y1, and the bit is required to have a specific value (logic "0"). As such, the bit Data[11] in the memory cell group G4 is found.

When the memory controller 360 finds the second bit (i.e., Data[11]) from the other memory cell groups (e.g., memory cell group G4), step S562 is performed after the step S550, and the memory controller 360 records the second bit, so as to prevent the subsequent PGM pulse operation from being repeatedly performed on the second bit. Step S565 is then performed after the step S562, and the memory controller 360 sets the input data signals HVDIN02 and HVDIN3 according to a specific data path group 123 corresponding to the specific memory cell group G3 and another data path group 124 corresponding to the other memory cell group G4, and sets the address control signal Y1 according to the logic address D10 corresponding to the first bit (i.e., Data[10]) of the input data Data. The reason why one single address control signal Y1 is set is that the address control signal corresponding to the bit Data[10] and the bit Data[11] is Y1. That is, the bits Data[10] and Data [11] share the address control signal Y1.

At this time, the number of times of performing the PGM pulse operations, the control path sequence, and the data path sequence are shown in Table 5.

TABLE 5

| Number of Times of Performing PGM Pulse Operations | Control Path Sequence | Data Path Sequence | Physical Addresses of To-Be-Programmed Memory Cells |
| --- | --- | --- | --- |
| 1 | Y0/Y1 | HVDIN0 | Bit00/Bit01 |
| 2 | Y2/Y3 | HVDIN0 | Bit02/Bit03 |
| 3 | Y0/Y2 | HVDIN1 | Bit04/Bit06 |
| 4 | Y1 | HVDIN2/3 | Bit09/Bit13 |

In step S570, the memory controller 360 performs the PGM pulse operation on the memory cells (with the physical address Bit09/Bit13) corresponding to the set input data signal HVDIN2/HVDIN3 and the set address control signal Y1 according to the row data corresponding to the number of times (i.e., 4) of performing the PGM pulse operations in Table 5 below.

Go back to the step S520. Since the bits of the input data Data corresponding to the logic addresses in the memory cell groups G5-G8 are all logic "1"s, the memory cells corresponding to these bits need not undergo the PGM pulse operation. Accordingly, after the steps S530, S532, and S590 are performed, the programming operation on the memory cell array 110 ends.

The above embodiments do not disclose the condition on which the second bit is not found in the step S550, which will be explained below. It is assumed that the bit Data[11] is a logic "1" instead of the logic "0" described in the foregoing embodiments. If the bit data [10] of the input data Data corresponding to the memory cell group G3 is already found, and if the step S550 is being performed, the memory controller 360 searches from the other following memory cell groups (e.g., the memory cell groups G4-G8) for a second bit having an address control signal identical to the address control signal Y1 of the first bit (i.e., Data [10]) in the specific memory cell group (i.e., the memory cell group G3). However, since the bits of the input data Data corresponding to the logic addresses in the memory cell groups G4 to G8 are all logic "1", no second bit is found. Thus, step S560 is then performed after the step S550, and the memory controller 360 sets the input data signal HVDIN02 according to the specific data path group 123 corresponding to the specific memory cell group G3, and sets the address control signal Y1 according to the logic address D10 corresponding to the first bit (i.e., Data[10]) of the input data Data.

At this time, the number of times of performing the PGM pulse operations, the control path sequence, and the data path sequence are shown in Table 6.

TABLE 6

| Number of Times of Performing PGM Pulse Operations | Control Path Sequence | Data Path Sequence | Physical Addresses of To-Be-Programmed Memory Cells |
|---|---|---|---|
| 1 | Y0/Y1 | HVDIN0 | Bit00/Bit01 |
| 2 | Y2/Y3 | HVDIN0 | Bit02/Bit03 |
| 3 | Y0/Y2 | HVDIN1 | Bit04/Bit06 |
| 4 | Y1 | HVDIN2 | Bit09 |

In step S570, the memory controller 360 performs the PGM pulse operation on the memory cells (with the physical address Bit09) corresponding to the specific memory cell group G3 and the logic address D10 (corresponding to the first bit Data [10]) according to the row data corresponding to the number of times (i.e., 4) of performing the PGM pulse operations in Table 6 below.

According to the previous embodiments, less number of times of performing the PGM pulse operations on the to-be-programmed memories in the memory cell array 110 is required; for instance, the memory device 100 depicted in FIG. 1 requires 16 number of times of the PGM pulse operations, while the memory device 300 depicted in FIG. 3 and provided in Table 5 or Table 6 requires 4 number of times of the PGM pulse operations, thereby maximizing the utilization rate of the voltage generator 140 depicted in FIG. 3.

To sum up, the memory controller in the memory device provided in one or more embodiments re-arranges the sequence of turning on the data path according to the input data in the data buffer (i.e., the control path sequence of the address control signals) and simultaneously re-arranges the data providing sequence of the data path (i.e., the data path sequence of the input data signal). Thereby, the memory cells that require the programming operation may undergo such an operation, and the memory cells that do not need such an operation are skipped over. As such, the number of times of performing the programming operation in the memory device may be reduced, so as to reduce the time spent on the programming operation.

It will be apparent to those skilled in the art that various modifications and variations can be made to the structure provided herein without departing from the scope of protection. In view of the foregoing, it is intended that the disclosure cover modifications and variations of this invention provided they fall within the scope of the following claims and their equivalents.

What is claimed is:

1. A memory device comprising:
a memory cell array comprising a plurality of memory cells;
a selection switch coupled to the memory cell array;
a row decoder coupled to the selection switch and receiving a memory cell address to generate address control signals;
a voltage generator coupled to the selection switch; and
a memory controller coupled to the row decoder and the voltage generator and obtaining input data to control the voltage generator to generate input data signals,
wherein the memory controller controls the row decoder according to input data to adjust a control path sequence of the address control signals, and the memory controller simultaneously controls the voltage generator to adjust a data path sequence of the input data signals, so as to perform a programming operation on the plurality of memory cells.

2. The memory device according to claim 1, wherein the memory device is an NOR cache memory.

3. The memory device according to claim 1, wherein the selection switch comprises a plurality of data path groups, each of the plurality of data path groups is constituted by a plurality of path switches, the number of bits of one of the address control signals is equal to the number of the plurality of path switches in one of the plurality of data path groups, and the number of the plurality of memory cells to be programmed in the memory cell array is equal to a product obtained by multiplying the number of the plurality of path switches in one of the plurality of data path groups by the number of the plurality of data path groups.

4. The memory device according to claim 3, wherein the to-be-programmed memory cells are categorized into a plurality of memory cell groups according to the number of the plurality of data path groups and physical addresses of the to-be-programmed memory cells, and the plurality of memory cell groups respectively corresponds to the plurality of data path groups,
wherein a mapping relationship between the physical addresses and logic addresses of the to-be-programmed memory cells is: the physical address of a $j^{th}$ memory cell of the plurality of memory cells in an $i^{th}$ memory cell group of the plurality of memory cell groups is $[(i-1)\times4+(j-1)]$, the logic address of the $j^{th}$ memory cell in the $i^{th}$ memory cell group is $[(j-1)\times8+(i-1)]$, i and j are positive integers, i is smaller than or equal to the number of the plurality of data path groups, and j is smaller than or equal to the number of the plurality of path switches in one of the plurality of data path groups,
wherein the logic addresses of the plurality of memory cells in the plurality of memory cell groups are the same as a logic address of the input data.

5. The memory device according to claim 3, wherein the memory controller sequentially searches in the input data for at least one first bit having a specific value, wherein the at least one first bit is corresponding to the logic addresses of the plurality of memory cells of the plurality of memory cell groups, and the specific value indicates the programming operation is required,
wherein if the at least one first bit corresponding to the logic addresses of the plurality of memory cells of a specific memory cell group has the specific value, the memory controller counts the number of the at least one first bit, wherein the specific memory cell group is one of the plurality of memory cell groups,
wherein if the number of the at least one first bit of the input data reaches a pumping capacity of the voltage generator, the memory controller sets the input data signals according to a specific data path group of the plurality of data path groups corresponding to the specific memory cell group, and sets the address control signals according to the logic address corresponding to the at least one first bit of the input data, so as to perform the programming operation on the plurality of memory cells corresponding to the logic addresses and the specific data path group.

6. The memory device according to claim 5, wherein if the number of the at least one first bit of the input data does not reach the pumping capacity of the voltage generator, the memory controller searches from the other memory cell groups for a second bit having an address control signal identical to the address control signal of the at least one first bit in the specific memory cell group, if the memory controller finds the second bit from the other memory cell groups, the memory controller sets the input data signals according to the specific data path group corresponding to the specific memory cell group and the other data path groups corresponding to the other memory cell groups, and sets the address control signal according to the logic address corresponding to the at least one first bit of the input data, so as to perform the programming operation on the plurality of memory cells corresponding to the specific data path group, the other data path groups, and the logic addresses.

7. The memory device according to claim 5, wherein if the memory controller does not find the second bit from the other memory cell groups, the memory controller sets the input data signals according to the specific data path group corresponding to the specific memory cell group, and sets the address control signal according to the logic address corresponding to the at least one first bit of the input data, so as to perform the programming operation on the plurality of memory cells corresponding to the specific data path group and the logic addresses.

8. The memory device according to claim 5, wherein if the at least one first bit corresponding to the logic addresses of the plurality of memory cells of the plurality of memory cell groups does not have the specific value, the memory controller stops performing the programming operation on the memory cell array.

9. A programming method of a memory cell array, comprising:
obtaining input data;
adjusting a control path sequence of address control signals according to the input data, and simultaneously adjusting a data path sequence of input data signals; and
performing a programming operation on some or all of a plurality of memory cells in the memory cell array according to the address control signals and the input data signals.

10. The programming method according to claim 9, wherein the memory cell array is located in an NOR cache memory.

11. The programming method according to claim 9, wherein the address control signals control a plurality of data path groups, each of the plurality of data path groups is constituted by a plurality of path switches, the number of bits of one of the address control signals is equal to the number of the plurality of path switches in one of the plurality of data path groups, and the number of the plurality of memory cells to be programmed in the memory cell array is equal to a product obtained by multiplying the number of the plurality of path switches in one of the plurality of data path groups by the number of the plurality of data path groups.

12. The programming method according to claim 11, further comprising:
categorizing the to-be-programmed memory cells into a plurality of memory cell groups according to the number of the plurality of data path groups and physical addresses of the to-be-programmed memory cells, the plurality of memory cell groups respectively corresponding to the plurality of data path groups,
wherein a relationship between the physical addresses and logic addresses of the to-be-programmed memory cells is: the physical address of a $j^{th}$ memory cell of the plurality of memory cells in an $i^{th}$ memory cell group of the plurality of memory cell groups is $[(i-1)\times 4+(j-1)]$, the logic address of the $j^{th}$ memory cell in the $i^{th}$ memory cell group is $[(j-1)\times 8+(i-1)]$, i and j are positive integers, i is smaller than or equal to the number of the plurality of data path groups, and j is smaller than or equal to the number of the plurality of path switches in one of the plurality of data path groups,
wherein the logic addresses of the plurality of memory cells in the plurality of memory cell groups are the same as a logic address of the input data.

13. The programming method according to claim 12, the step of adjusting the control path sequence of the address control signals according to the input data and simultaneously adjusting the data path sequence of the input data signals comprising:
sequentially searching in the input data for at least one first bit having a specific value, wherein the at least one first bit is corresponding to the logic addresses of the plurality of memory cells of the plurality of memory cell groups, and the specific value indicates the programming operation is required;
if the at least one first bit corresponding to the logic addresses of the plurality of memory cells of a specific memory cell group has the specific value, counting the number of the at least one first bit, wherein the specific memory cell group is one of the plurality of memory cell groups; and
if the number of the at least one first bit of the input data reaches a pumping capacity of the voltage generator, setting the input data signals according to a specific data path group of the plurality of data path groups corresponding to the specific memory cell groups, and setting the address control signals according to the logic address corresponding to the at least one first bit of the input data.

14. The programming method according to claim 13, the step of adjusting the control path sequence of the address control signals according to the input data and simultaneously adjusting the data path sequence of the input data signals further comprising:
if the number of the at least one first bit of the input data does not reach the pumping capacity of the voltage generator, searching from the other memory cell groups for a second bit having an address control signal identical to the address control signal of the at least one first bit in the specific memory cell group; and
if the second bit is found from the other memory cell groups, setting the input data signals according to the specific data path group corresponding to the specific memory cell group and the other data path groups corresponding to the other memory cell groups, and setting the address control signal according to the logic address corresponding to the at least one first bit of the input data.

15. The programming method according to claim 14, the step of adjusting the control path sequence of the address control signal according to the input data and simultaneously adjusting the data path sequence of the input data signals further comprising:

if the second bit is not found from the other memory cell groups, setting the input data signals according to the specific data path group corresponding to the specific memory cell group, and sets the address control signal according to the logic address corresponding to the at least one first bit of the input data.

16. The programming method according to claim 14, the step of adjusting the control path sequence of the address control signal according to the input data and simultaneously adjusting the data path sequence of the input data signals further comprising:

if the at least one first bit corresponding to the logic addresses of the plurality of memory cells of the plurality of memory cell groups does not have the specific value, stopping performing the programming operation on the memory cell array.

\* \* \* \* \*